US006201671B1

United States Patent
Pinarbasi

(10) Patent No.: US 6,201,671 B1
(45) Date of Patent: Mar. 13, 2001

(54) SEED LAYER FOR A NICKEL OXIDE PINNING LAYER FOR INCREASING THE MAGNETORESISTANCE OF A SPIN VALVE SENSOR

(75) Inventor: Mustafa Pinarbasi, Morgan Hill, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/205,470

(22) Filed: Dec. 4, 1998

(51) Int. Cl.[7] .................................................. G11B 5/39
(52) U.S. Cl. ................... 360/324.11; 360/324.1
(58) Field of Search ................... 360/324, 324.1, 360/324.11, 324.12; 324/252; 338/32 R

(56) References Cited

U.S. PATENT DOCUMENTS

| 5,432,734 | * 7/1995 | Kawano et al. ............... 360/324 |
| 5,587,026 | 12/1996 | Iwasaki et al. ............... 148/313 |
| 5,701,223 | 12/1997 | Fontana, Jr. et al. ............... 360/113 |
| 5,742,162 | 4/1998 | Nepala et al. ............... 324/252 |
| 5,793,207 | 8/1998 | Gill ............... 324/252 |
| 5,841,611 | * 11/1998 | Sakakima et al. ............... 360/324 |

FOREIGN PATENT DOCUMENTS 0 751 499 A1  1/1997 (EP).

* cited by examiner

Primary Examiner—David L. Ometz
(74) Attorney, Agent, or Firm—Gray Cary Ware & Freidenrich LLP; Ervin F. Johnston

(57) ABSTRACT

A bottom spin valve sensor employs a seed layer for a nickel oxide (NiO) antiferromagnetic pinning layer for the purpose of increasing magnetoresistance of the sensor (dR/R). The spin valve sensor can be a simple spin valve or an antiparallel (AP) spin valve sensor. In the preferred embodiment the seed layer is tantalum oxide $Ta_yO_x$ or copper (Cu).

21 Claims, 11 Drawing Sheets

US 6,201,671 B1

SEED LAYER FOR A NICKEL OXIDE PINNING LAYER FOR INCREASING THE MAGNETORESISTANCE OF A SPIN VALVE SENSOR

BACKGROUND OF THE INVENTION

1. Field of the Invention

The present invention relates to a seed layer for a nickel oxide (NiO) pinning layer for increasing the magnetoresistance of a spin valve sensor and more particularly to a seed layer between the first gap layer and the nickel oxide (NiO) pinning layer of a bottom spin valve sensor for increasing the magnetoresistance of the sensor.

2. Description of the Related Art

A spin valve sensor is employed by a read head for sensing magnetic fields on a moving magnetic medium, such as a rotating magnetic disk. The sensor includes a nonmagnetic electrically conductive first spacer layer sandwiched between a ferromagnetic pinned layer and a ferromagnetic free layer. An antiferromagnetic pinning layer interfaces the pinned layer for pinning the magnetic moment of the pinned layer 90° to an air bearing surface (ABS) which is an exposed surface of the sensor that faces the magnetic medium. First and second leads are connected to the spin valve sensor for conducting a sense current therethrough. The magnetic moment of the free layer is free to rotate in positive and negative directions from a zero bias point position in response to positive and negative magnetic fields from a moving magnetic medium. The zero bias position is the position of the magnetic moment of the free layer when the sensor is in a quiescent state, namely when the sense current is conducted through the sensor without any magnetic field incursions from a rotating magnetic disk. The magnetic moment is preferably parallel to the ABS in the quiescent state of the sensor. If the magnetic moment of the free layer is not substantially parallel to the ABS in the quiescent state, there will be read signal asymmetry upon the occurrence of positive and negative magnetic field incursions from a rotating disk.

The thickness of the spacer layer is chosen to be less than the mean free path of electrons conducted through the sensor. With this arrangement, a portion of the conduction electrons are scattered by the interfaces of the spacer layer with the pinned and free layers. When the magnetic moments of the pinned and free layers are parallel with respect to one another scattering is minimal and when their magnetic moments are antiparallel scattering is maximized. Changes in scattering changes the resistance of the spin valve sensor as a function of $\cos \theta$, where $\theta$ is the angle between the magnetic moments of the pinned and free layers. A spin valve sensor has a significantly higher magnetoresistance than an anisotropic magnetoresistive (AMR) sensor. For this reason it is sometimes referred to as a giant magnetoresistive (GMR) sensor.

The location of the bias point on the transfer curve is influenced by four major forces on the free layer, namely a ferromagnetic coupling field ($H_{FC}$) between the pinned layer and the free layer, a demag field ($H_{demag}$) from the pinned layer, sense current fields ($H_{SC}$) from all conductive layers of the spin valve sensor except the free layer, and the influence of an AMR effect. The influence of the AMR effect on the bias point is the same as a magnetic influence and can be defined in terms of magnitude and direction.

A bottom spin valve sensor typically employs a nickel oxide (NiO) pinning layer for pinning the magnetic moment of the pinned layer perpendicular to the ABS. The pinning layer is formed directly on the first gap layer of alumina ($Al_2O_3$) and the pinned layer is formed directly on the pinning layer. Subsequent layers formed are the spacer layer, the free layer, the second gap layer and the second shield layer. At this stage the spin valve sensor has a magnetoresistance which is dR/R where R is the resistance of the sensor and dR is the change in resistance of the sensor upon the application of the applied field. Subsequently, the write head is formed on the spin valve sensor. In the formation of the write head the multiple photoresist layers of the insulation stack are hard baked 225° to 250° for 6–11 hours. This hard baking reduces the aforementioned magnetoresistance of the sensor. The amount of reduction determines the thermal stability of the sensor.

Efforts continue to build spin valve sensors with high magnetoresistance that survive the hard baking cycles of the write head. High magnetoresistance equates to increased sensitivity of the spin valve sensor to magnetic flux incursions from a rotating disk. Another consideration, however, is the ferromagnetic coupling field ($H_C$) between the pinned layer and the free layer. It is desirable to minimize the ferromagnetic coupling field since the ferromagnetic coupling field affects the bias point of the sensor. A ferromagnetic coupling must be counterbalanced by some other magnetic field in order to achieve a zero bias point. Sense current fields exerted on the free layer must also be counterbalanced. As the search continues to increase the magnetoresistance it is important that the spin valve sensor not be degraded by some other factor, such as a high ferromagnetic coupling between the pinned and free layers.

SUMMARY OF THE INVENTION

I have discovered that by employing particular seed layers for a nickel oxide (NiO) pinning layer in a bottom spin valve that the magnetoresistance of the spin valve can be increased. In a preferred embodiment a tantalum oxide ($Ta_yO_x$) seed layer is formed directly on the first gap layer and the nickel oxide (NiO) pinning layer is formed directly on the tantalum oxide seed layer. This is followed by the spacer and free layers and ultimately the write head. My investigation demonstrates that only a normal drop occurs in the magnetoresitance after the baking step in the construction of the write head. My investigation also demonstrates that the invention is applicable to an antiparallel (AP) pinned bottom spin valve sensor as well as the aforementioned simple bottom spin valve sensor. The AP pinned bottom spin valve sensor employs a pinned layer that has a ruthenium (Ru) film located between first and second magnetic films which may be cobalt (Co). My investigation further shows the application of a copper (Cu) seed layer for increasing the magnetoresistance.

An object of the present invention is to provide a spin valve sensor with improved magnetoresistance.

Another object is to provide improved magnetoresistance of a bottom simple or AP pinned spin valve sensor without degrading other performance factors of the sensor.

A further object is to provide a seed layer for a nickel oxide (NiO) pinning layer of a bottom simple or AP pinned spin valve sensor that increases the magnetoresistance of the sensor without increasing the ferromagnetic coupling between the pinned layer and the free layer beyond an acceptable level.

Other objects and advantages of the invention will become apparent upon reading the following description taken together with the accompanying drawings.

DESCRIPTION OF THE PREFERRED EMBODIMENT

Magnetic Disk Drive

Figure 1:
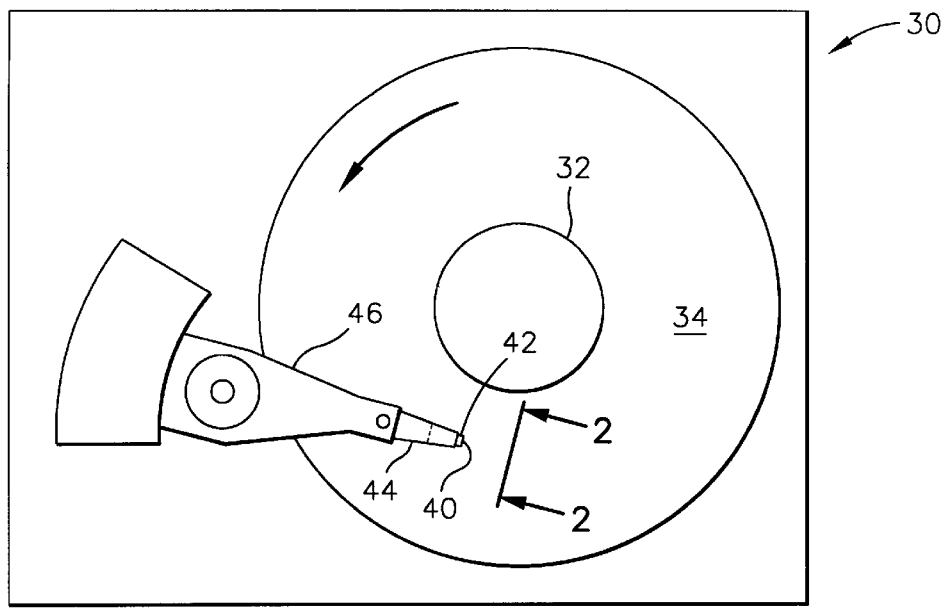
FIG. 1 is a planar view of an exemplary magnetic disk drive.
Figure 2:
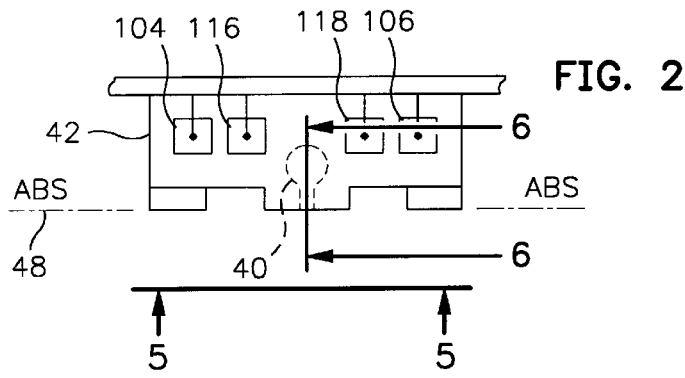
FIG. 2 is an end view of a slider taken along plane 2—2 with a magnetic head shown in hidden lines.
Figure 3:
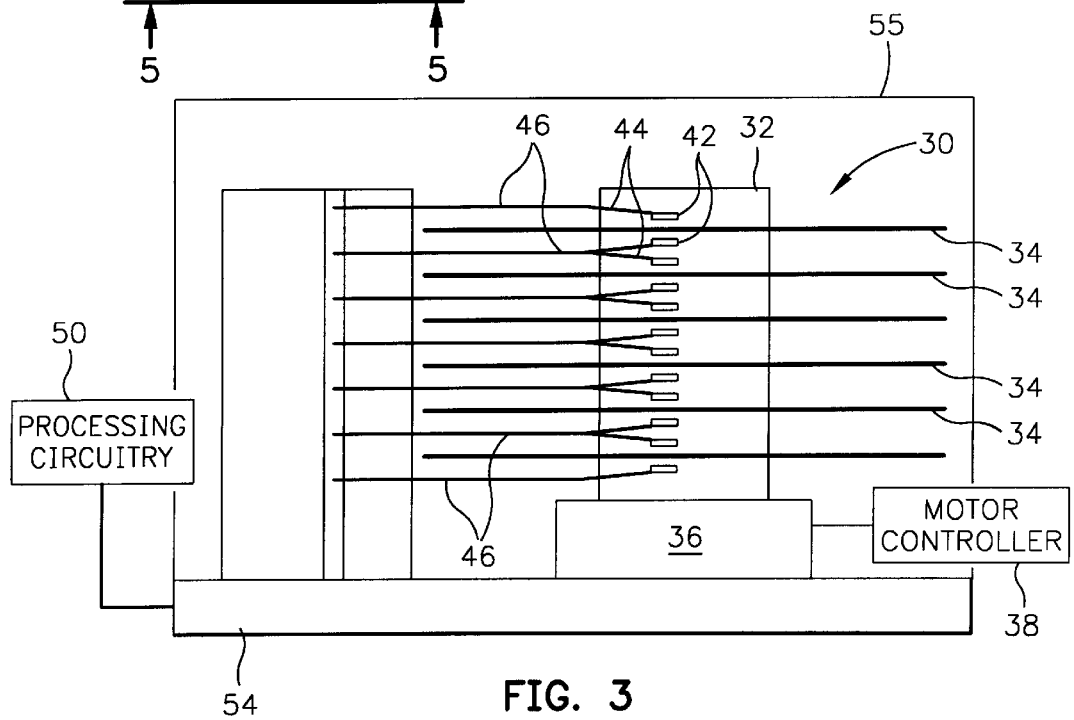
FIG. 3 is an elevation view of the magnetic disk drive wherein multiple disks and magnetic heads are employed.
Figure 4:
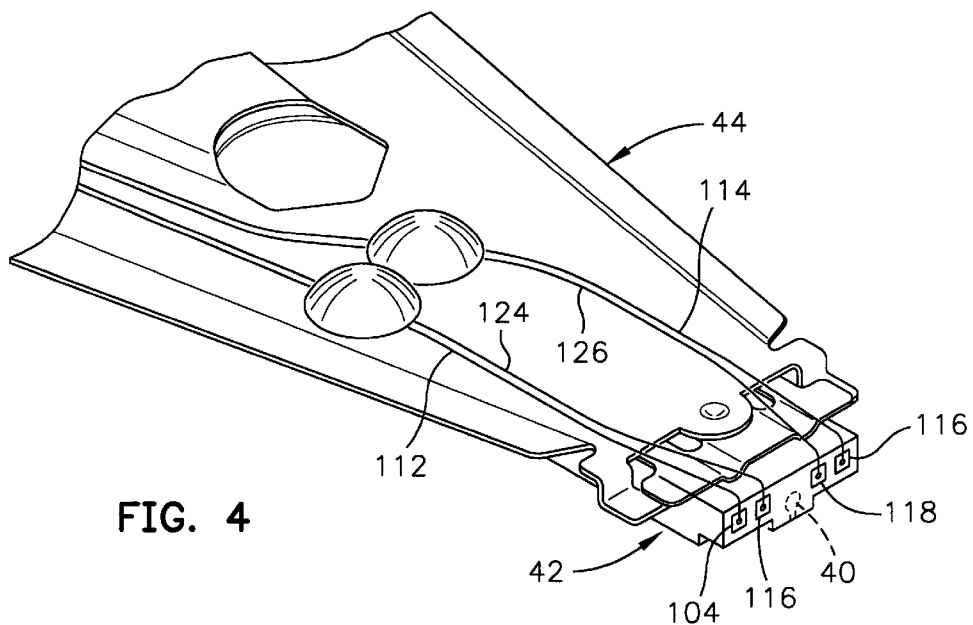
FIG. 4 is an isometric illustration of an exemplary suspension system for supporting the slider and magnetic head.

Referring now to the drawings wherein like reference numerals designate like or similar parts throughout the several views there is illustrated in FIGS. 1–3 a magnetic disk drive 30. The drive 30 includes a spindle 32 that supports and rotates a magnetic disk 34. The spindle 32 is rotated by a motor 36 that is controlled by a motor controller 38. A combined read and write magnetic head 40 is mounted on a slider 42 that is supported by a suspension 44 and actuator arm 46. A plurality of disks, sliders and suspensions may be employed in a large capacity direct access storage device (DASD) as shown in FIG. 3. The suspension 44 and actuator arm 46 position the slider 42 so that the magnetic head 40 is in a transducing relationship with a surface of the magnetic disk 34. When the disk 34 is rotated by the motor 36 the slider is supported on a thin (typically, 0.05 μm) cushion of air (air bearing) between the surface of the disk 34 and the air bearing surface (ABS) 48. The magnetic head 40 may then be employed for writing information to multiple circular tracks on the surface of the disk 34, as well as for reading information therefrom. Processing circuitry 50 exchanges signals, representing such information, with the head 40, provides motor drive signals for rotating the magnetic disk 34, and provides control signals for moving the slider to various tracks. In FIG. 4 the slider 42 is shown mounted to the suspension 44. The components described hereinabove may be mounted on a frame 54 of a housing 55 as shown in FIG. 3.

Figure 5:
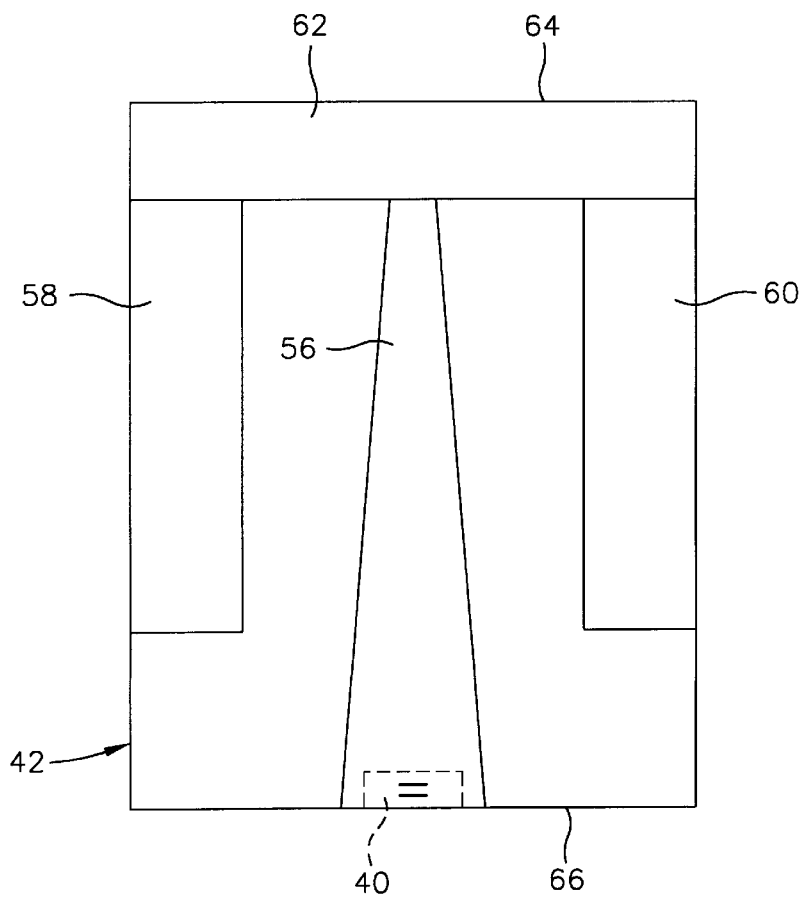
FIG. 5 is an ABS illustration of the slider taken along plane 5—5 of FIG. 2.

FIG. 5 is an ABS view of the slider 42 and the magnetic head 40. The slider has a center rail 56 that supports the magnetic head 40, and side rails 58 and 60. The rails 56, 58 and 60 extend from a cross rail 62. With respect to rotation of the magnetic disk 34, the cross rail 62 is at a leading edge 64 of the slider and the magnetic head 40 is at a trailing edge 66 of the slider.

Magnetic Head

Figure 6:
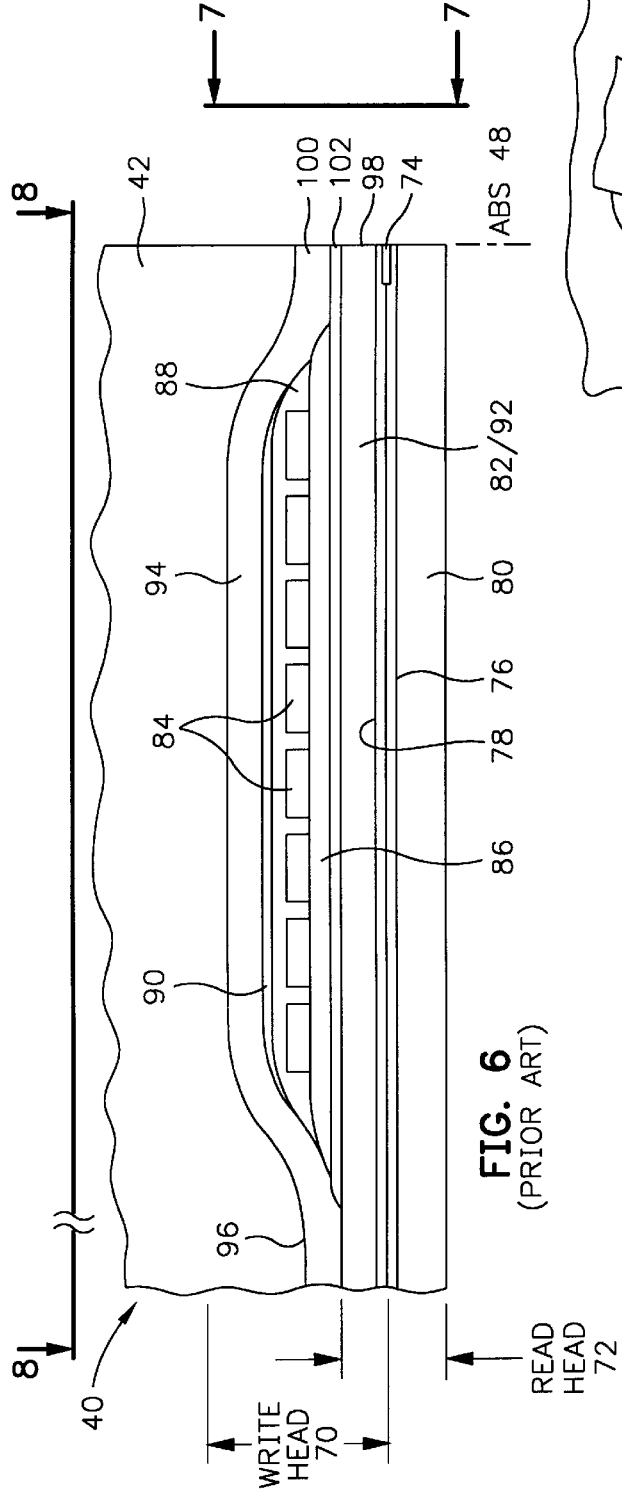
FIG. 6 is a partial elevation view of the slider and magnetic head as seen in plane 6—6 of FIG. 2.
Figure 7:
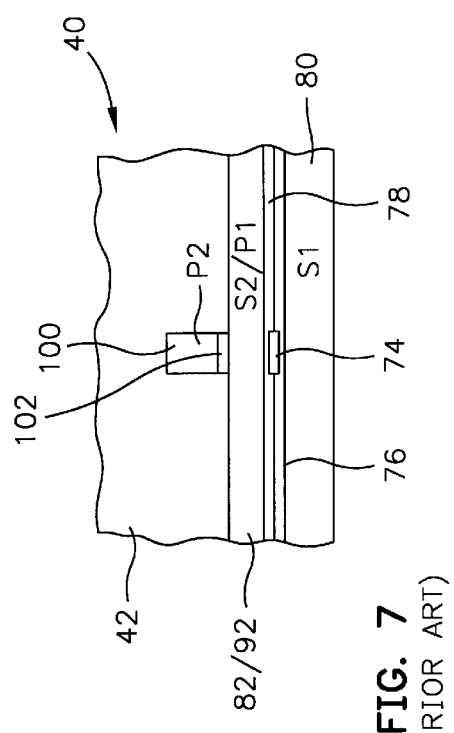
FIG. 7 is a partial ABS view of the slider taken along plane 7—7 of FIG. 6 to show the read and write elements of the magnetic head.

FIG. 6 is a side cross-sectional elevation view of the magnetic head 40 which has a write head portion 70 and a read head portion 72, the read head portion employing a spin valve sensor 74 of the present invention. FIG. 7 is an ABS view of FIG. 6. The sensor 74 is located between first and second gap layers 76 and 78 and the gap layers are located between first and second shield layers 80 and 82. In response to external magnetic fields, the resistance of the sensor 74 changes. A sense current $I_S$ (see FIG. 9) conducted through the sensor causes these resistance changes to be manifested as potential changes. These potential changes are then processed as readback signals by the processing circuitry 50 shown in FIG. 3.

Figure 8:
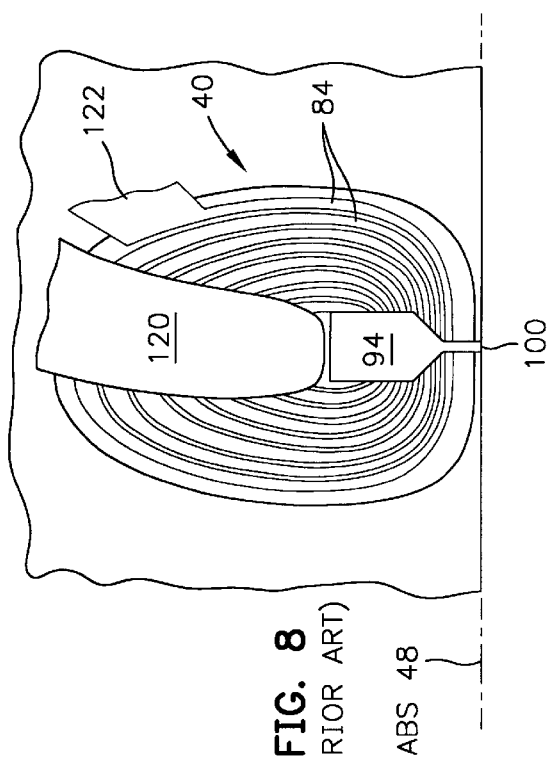
FIG. 8 is a view taken along plane 8—8 of FIG. 6 with all material above the coil layer removed.

The prior art write head portion of the magnetic head includes a coil layer 84 located between first and second insulation layers 86 and 88. A third insulation layer 90 may be employed for planarizing the head to eliminate ripples in the second insulation layer caused by the coil layer 84. The first, second and third insulation layers are referred to in the art as an "insulation stack". The coil layer 84 and the first, second and third insulation layers 86, 88 and 90 are located between first and second pole piece layers 92 and 94. The first and second pole piece layers 92 and 94 are magnetically coupled at a back gap 96 and have first and second pole tips 98 and 100 which are separated by a write gap layer 102 at the ABS. As shown in FIGS. 2 and 4, first and second solder connections 104 and 116 connect leads from the sensor 74 to leads 112 and 124 on the suspension 44. Third and fourth solder connections 118 and 106 connect leads 120 and 122 from the coil 84 (see FIG. 8) to leads 126 and 114 on the suspension. It should be noted that the magnetic head 40 employs a single layer 82/92 to serve a double function as a second shield layer for the read head and as a first pole piece for the write head. This type of magnetic head is referred to in the art as a "merged head". A piggyback head employs two separate layers for these functions.

The Invention

Figure 9:
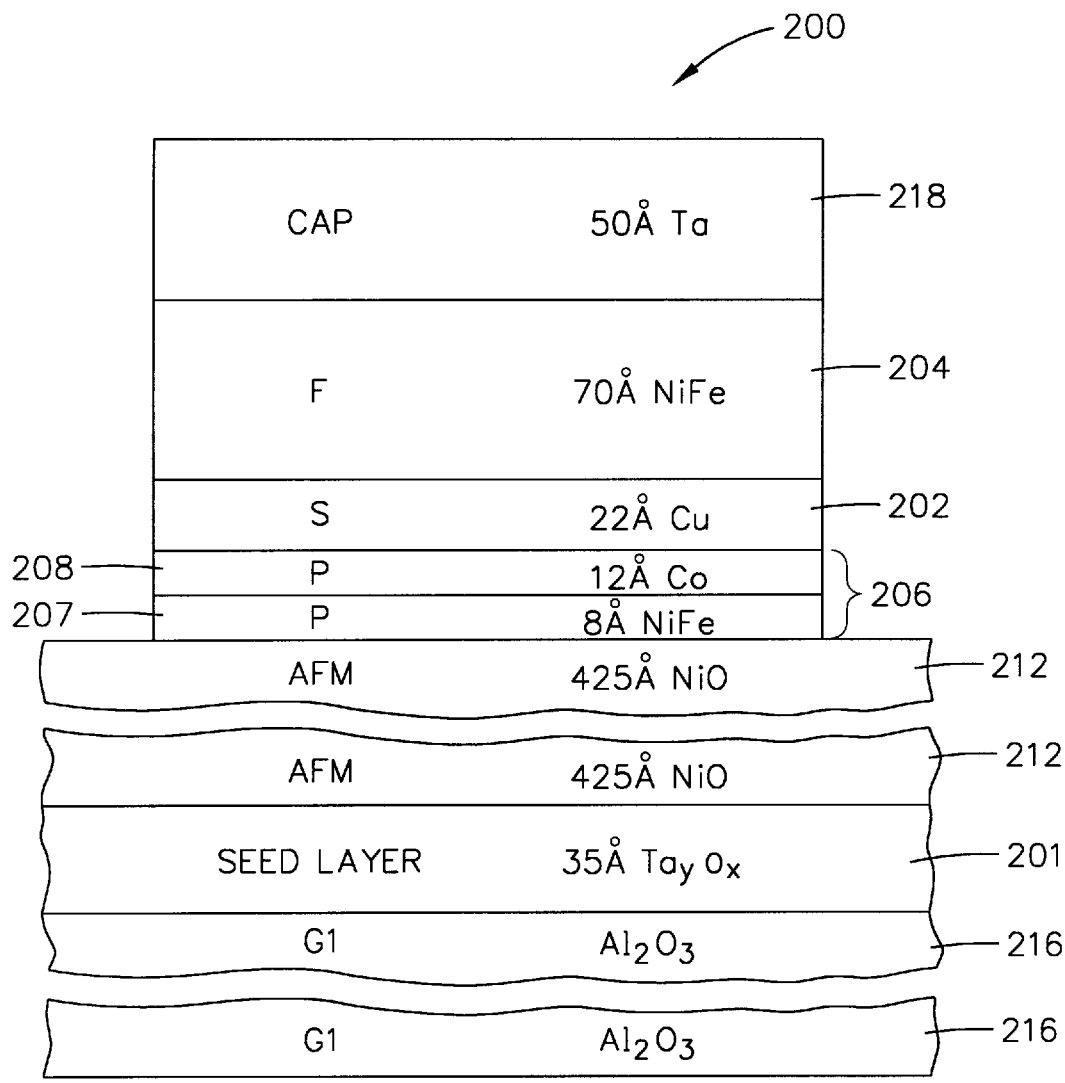
FIG. 9 is an ABS illustration of a simple bottom spin valve sensor with a tantalum oxide seed layer of the present invention for the AFM layer.
Figure 10:
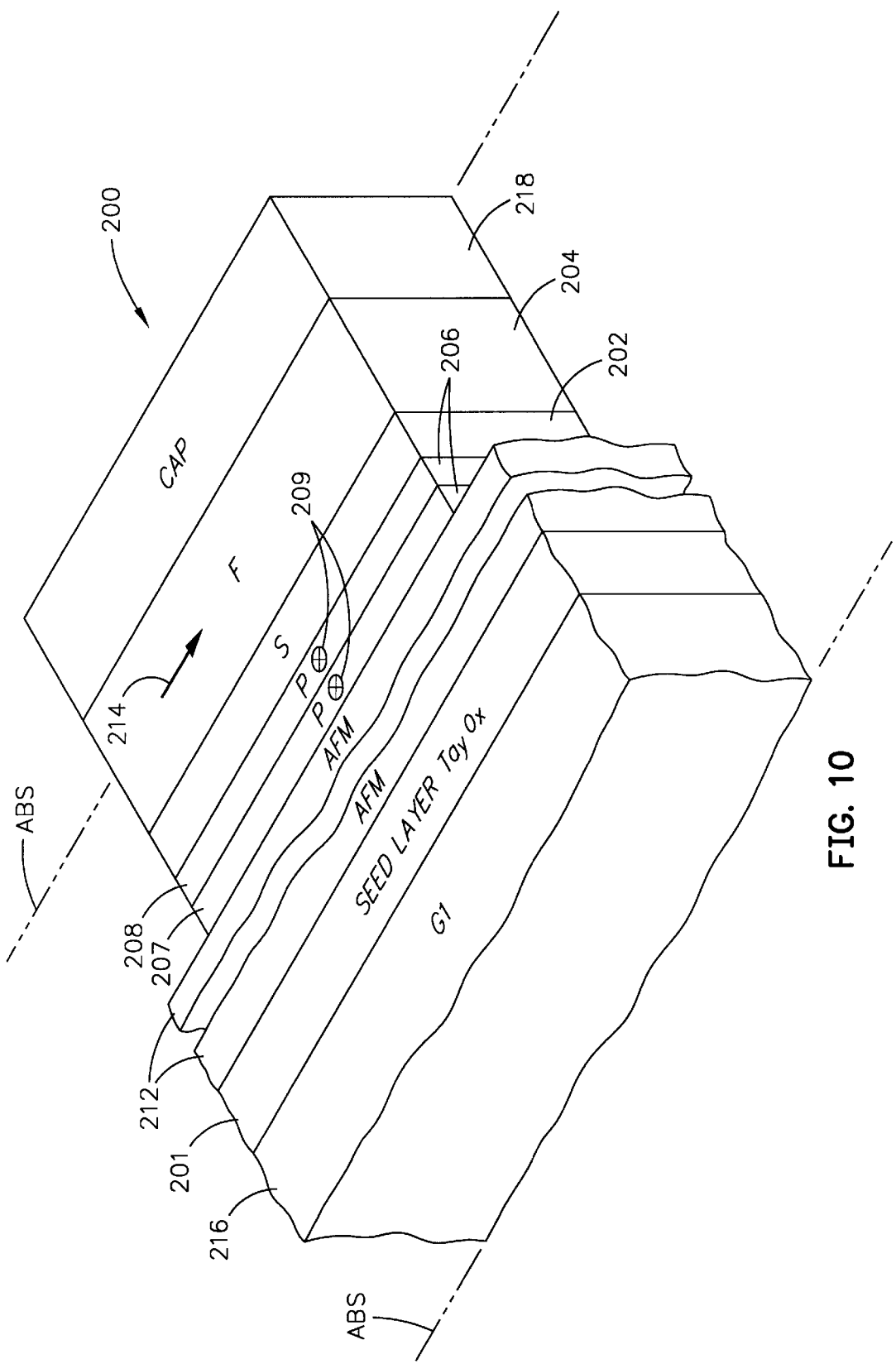
FIG. 10 is an isometric illustration of FIG. 9.

FIGS. 9 and 10 are schematic illustrations of the present spin valve sensor 200 of a read head which includes a nonmagnetic electrically conductive spacer layer 202 which is sandwiched between a ferromagnetic free layer 204 and a ferromagnetic pinned layer 206. The pinned layer 206, which may have a nickel iron (NiFe) first pinned film 207 and a cobalt (Co) second pinned film 208, has a magnetic moment 209 (see FIG. 10) which is preferably pinned perpendicular to the ABS 210 by an antiferromagnetic (AFM) layer 212. Each circle with an x in it ($\hat{x}$) indicates that the direction of the magnetic moment is directed away from the reader. In a quiescent state (sense current $I_S$ conducted through the sensor 200 but without any magnetic incursion from a rotating magnetic disk) a magnetic moment 214 of the free layer 204 is preferably parallel to the ABS 210. Accordingly, when positive and negative incursions are imposed on the spin valve sensor 200 from a rotating magnetic disk the magnetic moment 214 of the free layer rotates upwardly and downwardly respectively from the parallel position shown in FIG. 10. The parallel position of the magnetic moment 214 is generally the zero bias point on the transfer curve of the spin valve sensor and when it is positioned upwardly or downwardly from this parallel position in a quiescent state the bias point of the spin valve sensor is not zero but some value positive or negative with respect to the zero position. When the magnetic moment 214 is in the zero bias position the read signal has symmetry about the bias point, but when the magnetic moment is angled upwardly or downwardly from the parallel position, shown in FIG. 10, the read signal is asymmetric. Accordingly, it is desirable that the magnetic moment 214 of the free layer be located at the zero bias point, which is the parallel position shown in FIG. 10, when the read sensor 200 is in a quiescent state, namely sense current $I_S$ on but no magnetic incursion from a rotating magnetic disk.

As stated hereinabove, there are various forces acting on the magnetic moment 214 of the free layer when the spin valve read sensor is in a quiescent state. These forces include a ferromagnetic coupling field between the free layer 204 and the pinned layer 206, a demag field from the pinned layer 206, sense current fields when the sense current $I_S$ is conducted through the sensor from all conductive layers of the spin valve sensor except the free layer 204 and the influence of an AMR effect. The stronger of these influences is the sense current fields from the spacer layer 202 and the pinned layer 206. The AFM layer 212 is constructed on the first gap layer 216 which first gap layer is also shown at 76 in FIG. 6. A cap layer 218, which may be tantalum (Ta) is constructed on the free layer 204 before constructing the second gap layer 78 shown in FIG. 6.

The AFM layer may be 425 Å of nickel oxide (NiO), the pinned layer 207 may be 8 Å of nickel iron (NiFe), the pinned layer 208 may be 12 Å of cobalt (Co), the spacer layer may be 22 Å of copper (Cu), the free layer 204 may be 70 Å of nickel iron (NiFe) and the cap layer 218 may be 50 Å of tantalum (Ta). During the making of the write head the sensor 200 is subjected to annealing of 230° C. for 10 hours. After the making of the head the AFM layer 212 is reset by applying heat at a temperature of 200° C. to 250° C. for 10 minutes in the presence of a field that is directed perpendicular to the ABS. This sets the magnetic spins of the AFM layer 212 in the perpendicular direction which, by exchange coupling, pins the magnetic moments of the pinned films 207 and 208 in the same direction, namely perpendicular to the ABS.

In one embodiment of the present invention a tantalum oxide ($Ta_yO_x$) seed layer 201 is employed between the first gap layer 216 and the AFM layer 212 as shown in FIGS. 9 and 10. The tantalum oxide seed layer increases the magnetoresistance (dR/R) of the sensor 200 as compared to a simple bottom spin valve sensor without the tantalum oxide seed layer in the instances of the as deposited state of the sensor, after resetting the AFM layer 212 and after hard baking the insulation layers of the write head. The tantalum oxide seed layer 201 does not significantly increase the ferromagnetic coupling field between the pinned layer 208 and free layer 204. Further, since tantalum oxide is nonconductive no sense current is shunted therethrough nor is there any sense current field exerted on the free layer 204 to affect its bias point. In another embodiment (not shown) copper may be employed for the seed layer 201 for increasing the dR/R. The tantalum oxide seed layer is preferred over a copper seed layer, however, because the copper will shunt a portion of the sense current and affect the bias point of the free layer 304.

Figure 11:
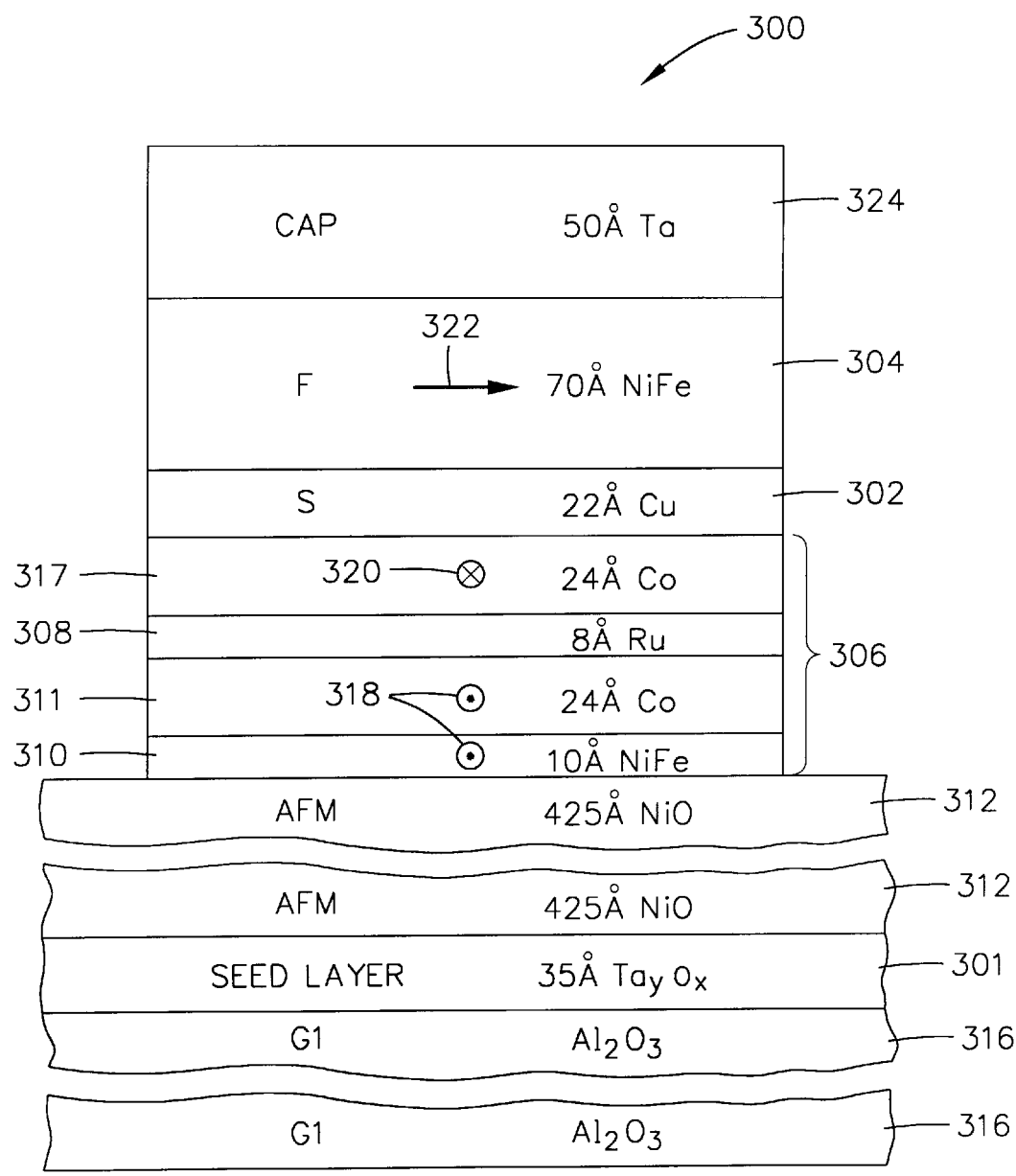
FIG. 11 is an ABS illustration of an AP pinned bottom spin valve sensor with a tantalum oxide seed layer for the AFM layer.
Figure 12:
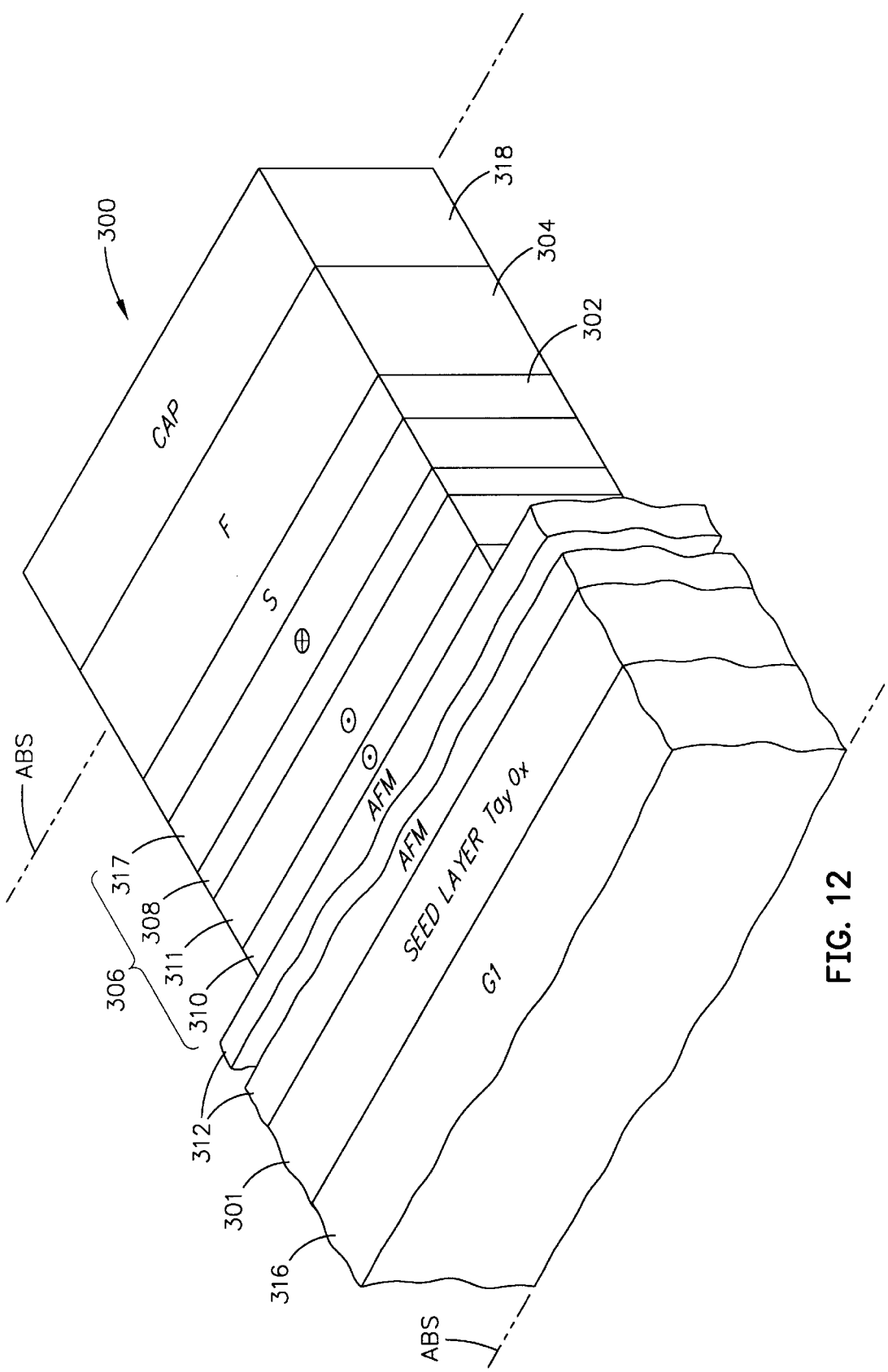
FIG. 12 is an isometric illustration of FIG. 11.

In FIGS. 11 and 12 an antiparallel (AP) pinned bottom spin valve 300 is shown which has a tantalum oxide ($Ta_yO_x$) seed layer 301. In this embodiment a spacer layer 302 is located between a free layer 304 and an AP pinned layer 306. The AP pinned layer 306, which is described in U.S. Pat. No. 5,701,223 and which is incorporated by reference herein, may include an 8 Å ruthenium (Ru) spacer layer 308 which is located between pinned films 310 and 311 on one side that are exchange coupled to an antiferromagnetic (AFM) layer 312 and an antiparallel pinned layer 317 on the other side that is adjacent the spacer layer 302. The AFM layer 312 pins the magnetic moments 318 of the pinned films 310 and 311 in one direction perpendicular to the ABS and the magnetic moment 320 of the AP pinned film 317 is pinned in an opposite direction perpendicular to the ABS. Each circle with an dot in it (⊙) indicates that the direction of the magnetic moment is toward the reader. The pinned film 310 may be 10 Å of nickel iron (NiFe), the pinned film 311 may be 24 Å of cobalt (Co), the spacer layer 308 may be 8 Å of ruthenium (Ru) and the AP pinned film 317 may be 24 Å of cobalt (Co). The magnetic moment 322 of the free layer 304 is shown parallel to the ABS. A cap layer 324 is constructed on the free layer 304 before construction of the second gap layer 78 and write head 70 shown in FIG. 6.

The seed layer 301 may be 35 Å of tantalum oxide ($Ta_yO_x$), the AFM layer 312 may be 425 Å of nickel oxide, the spacer layer 302 may be 22 Å of copper (Cu), the free layer 304 may be 70 Å of nickel iron (NiFe) and the cap layer 324 may be 50 Å of tantalum (Ta). The magnetoresistance of the spin valve sensor 300, is improved by employing a tantalum oxide ($Ta_yO_x$) seed layer as compared to a bottom AP pinned spin value sensor that does not employ such a seed layer in the instances of an as deposited state of the sensor, after resetting the AFM layer 212 and after hard baking the insulation layers of the write head. Further the tantalum oxide seed layer does not significantly increase the ferromagnetic coupling field between the pinned layer 208 and the free layer 204. Further, the tantalum oxide seed layer is not conductive and will not shunt any of the sense current nor will it exert a sense current field on the free layer 304 that affects its bias point.

Figure 13:
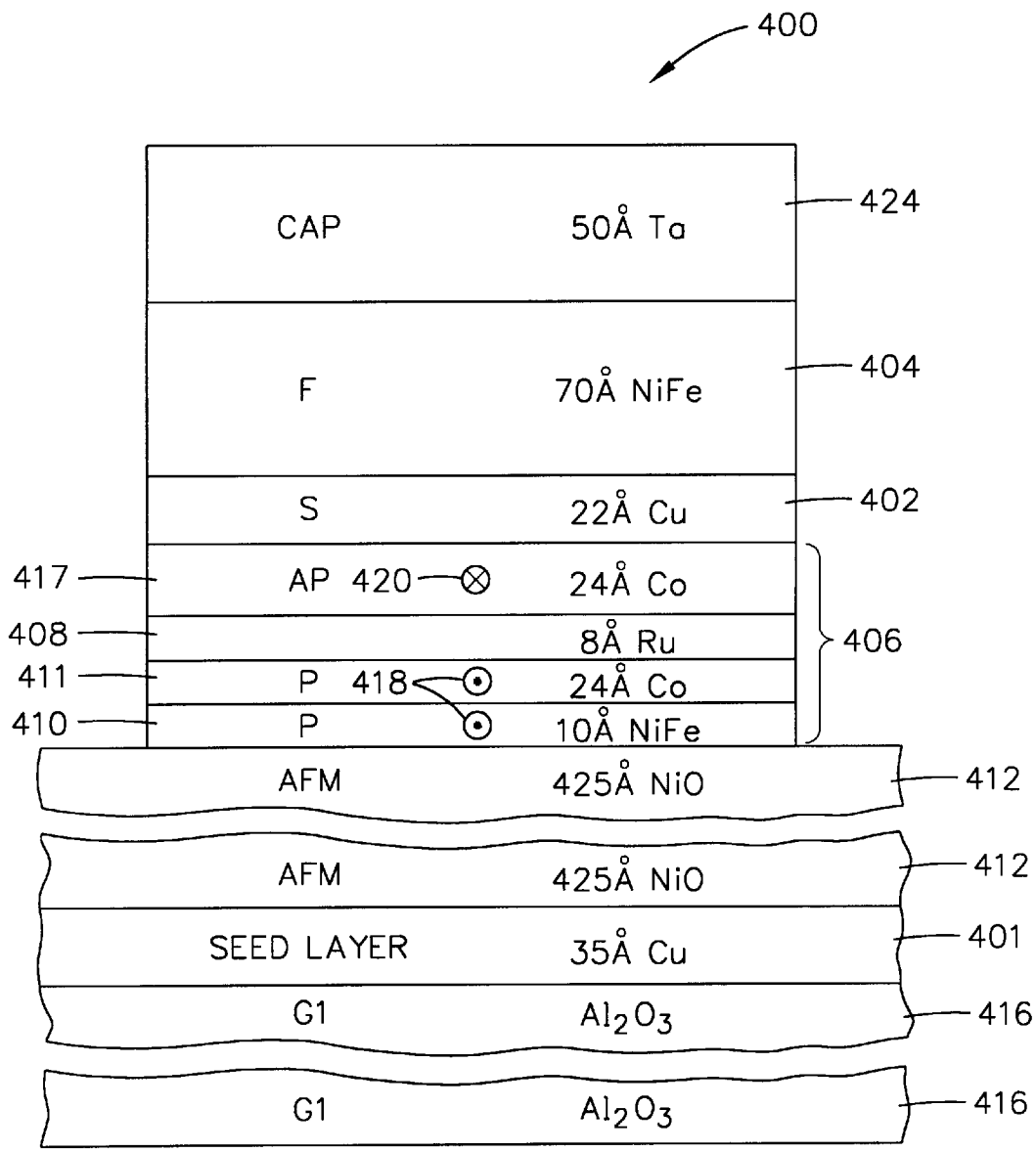
FIG. 13 is an ABS illustration of an AP pinned bottom spin valve sensor with a copper (Cu) seed layer for the antiferromagnetic (AFM) pinning layer.
Figure 14:
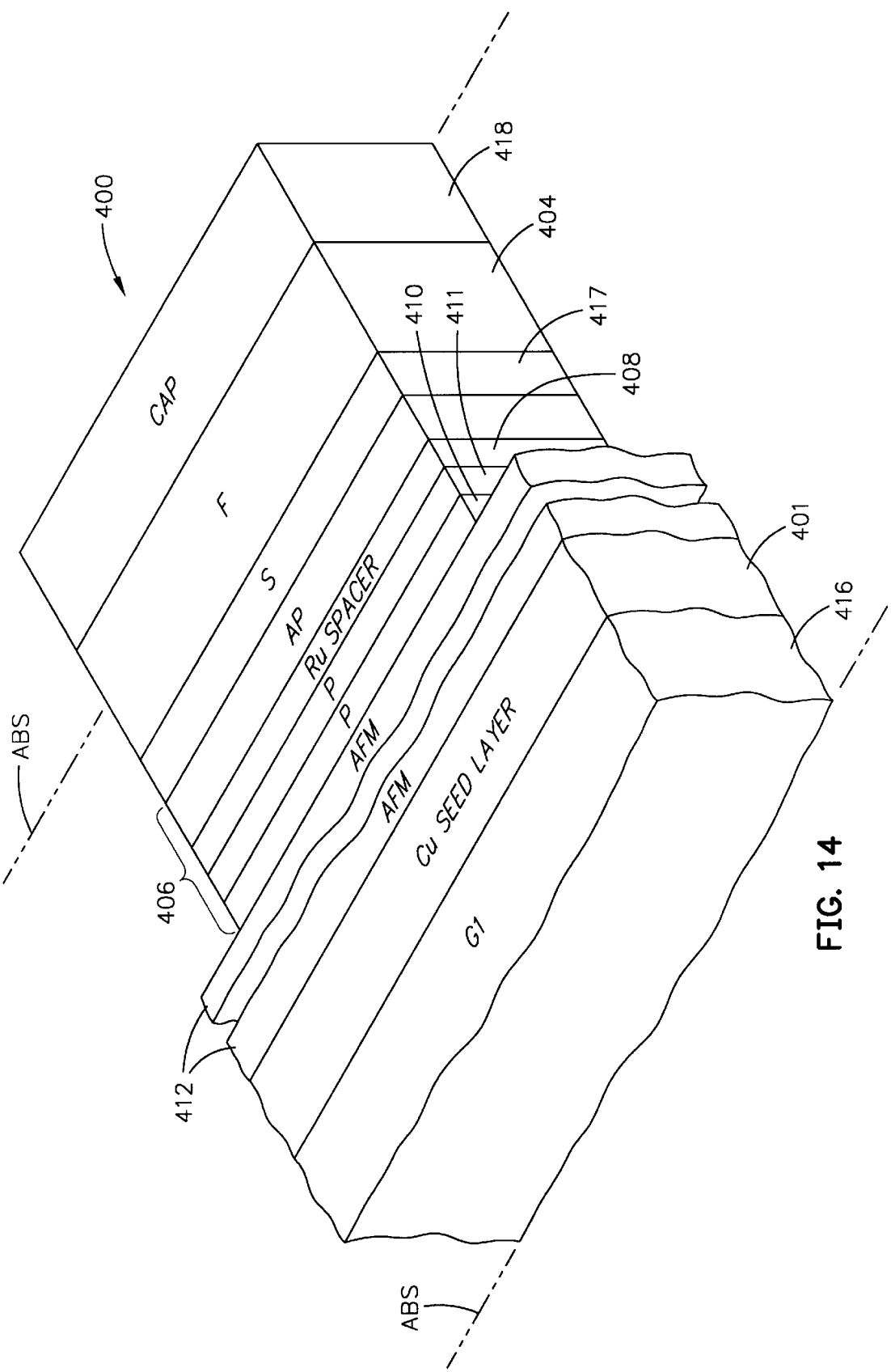
FIG. 14 is an isometric illustration of FIG. 13.

FIGS. 13 and 14 show an antiparallel (AP) pinned bottom spin valve sensor which may employ a 35 Å copper (Cu) seed layer 401 for the 425 Å nickel oxide (NiO) AFM layer 412. The layers in this example are the same as the layers in FIGS. 11 and 12, except for the copper seed layer 401. The spin valve sensor 400 in FIGS. 13 and 14 has improved magnetoresistance over an AP pinned bottom spin valve sensor without the copper seed layer 401. The copper seed layer is conductive and will shunt a portion of the sense current. For this reason the tantalum oxide seed layer of FIGS. 11 and 12 is preferred.

Figure 15A:
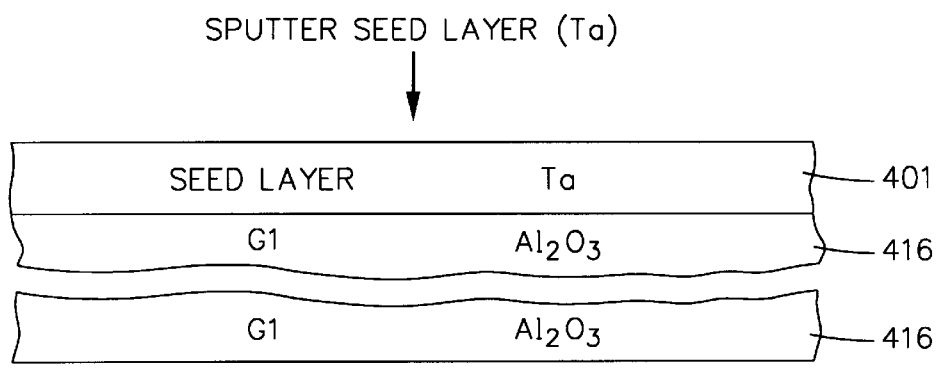
FIGS. 15A, 15B and 15C show a first method of making the tantalum oxide seed layer of the present invention.
Figure 15B:
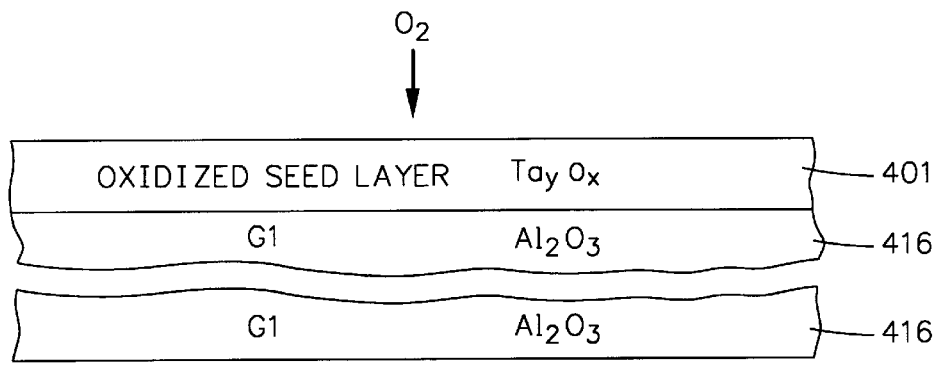
Figure 15C:
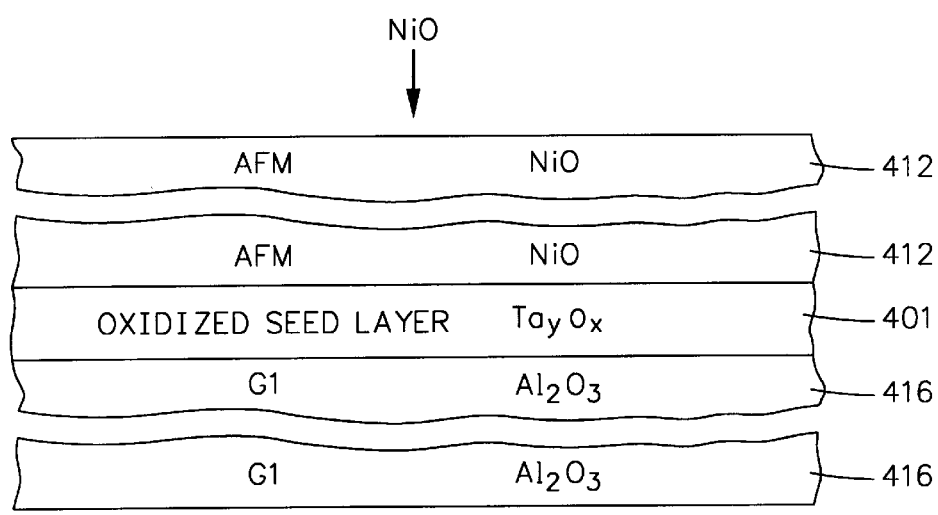

A method of constructing the tantalum oxide ($Ta_yO_x$) seed layer 401 of FIGS. 11 and 12 is shown in FIGS. 15A, 15B and 15C. In FIG. 15A a tantalum seed layer 401 deposited on the first gap layer (G1). Subsequently, the seed layer 401 is subjected to oxygen which causes a top surface portion to oxidize. These steps can be accomplished in a sputtering chamber (not shown) wherein the tantalum (Ta) seed layer is sputtered onto the first gap layer (G1), as shown in FIG. 15A, followed by the introduction of oxygen through an inlet into the chamber so as to oxidize the seed layer. This is followed by deposition of the nickel oxide (NiO) AFM layer 412 as shown in FIG. 15C. The dR/R in this embodiment was 4.53% and the ferromagnetic coupling field ($H_C$) of the AP pinned layer 316 to the free layer 304 was 4.0 Oe.

Figure 16A:
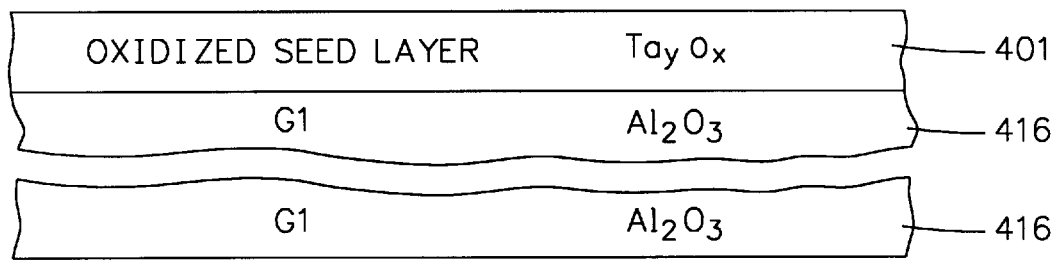
FIGS. 16A and 16B show a second method of making the tantalum oxide seed layer of the present invention.
Figure 16B:
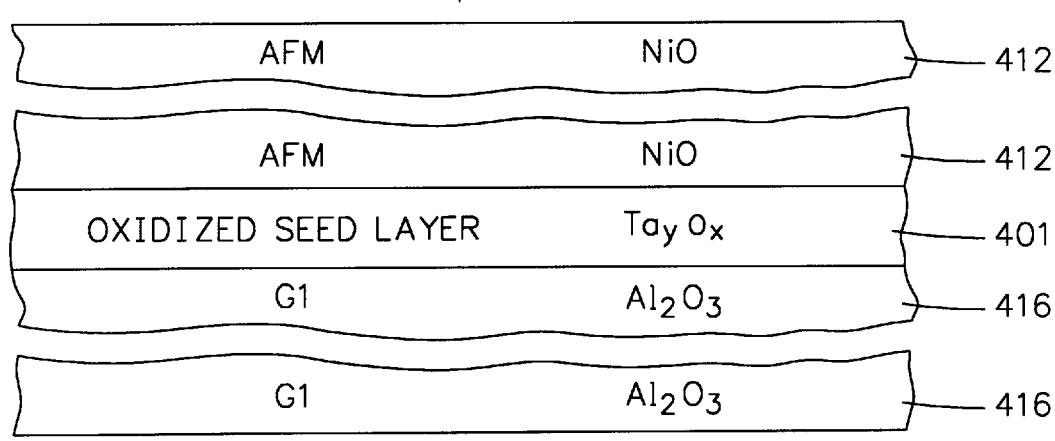

In FIG. 16A the tantalum oxide (Ta) seed layer was sputter deposited in the presence of oxygen ($O_2$) which is referred to in the art as reactive ion beam sputter deposition. Next, the nickel oxide (NiO) AFM layer 412 is deposited on the seed layer 401 as shown in FIG. 16B. The dR/R in this embodiment was 4.65% and the ferromagnetic coupling field (Hc) was 4.0 Oe.

SUMMARY

It can be seen that a tantalum oxide ($Ta_yO_x$) seed layer for a nickel oxide (NiO) AFM layer in a bottom AP pinned spin valve sensor increases the dR/R. It is believed that the tantalum oxide seed layer improves the nickel oxide (NiO) pinning layer by making its microstructure more uniform from top to bottom. It is further speculated that it improves the grain size and its texture. It should be understood that other thicknesses may be employed for the various layers described hereinabove without departing from the spirit of the invention. Regardless of the thicknesses of the tantalum oxide seed layer it will improve the microstructure of the AFM nickel oxide (NiO) pinning layer to increase the dR/R of the sensor. The invention also includes employing a tantalum oxide or copper seed layer in a spin valve sensor that does not use an AP pinned layer as shown in FIGS. 9 and 10.

Clearly, other embodiments and modifications of this invention will occur readily to those of ordinary skill in the art in view of these teachings. Therefore, this invention is to be limited only by the following claims, which include all such embodiments and modifications when viewed in conjunction with the above specification and the accompanying drawings.

I claim:

1. A spin valve sensor that has an air bearing surface (ABS) comprising:
   a ferromagnetic pinned layer having a magnetic moment;
   an antiferromagnetic pinning layer of nickel oxide (NiO) exchange coupled to the pinned layer for pinning the magnetic moment of the pinned layer;
   a ferromagnetic free layer;
   a nonmagnetic electrically conductive spacer layer sandwiched between and interfacially engaging the pinned layer and the free layer;
   a seed layer of tantalum oxide or copper; and
   the pinning layer being sandwiched between the seed layer and the pinned layer with the seed layer interfacially engaging the pinning layer.

2. A spin valve sensor as claimed in claim 1 wherein the seed layer is $Ta_yO_x$ which has been reactively ion beam sputtered in the presence of oxygen ($O_2$).

3. A spin valve sensor as claimed in claim 1 wherein the seed layer comprises $Ta_yO_x$ which has been oxidized by exposure to oxygen ($O_2$).

4. A spin valve sensor as claimed in claim 1 wherein the seed layer is copper (Cu).

5. A spin valve sensor as claimed in claim 1 wherein the pinned layer is an antiparallel (AP) pinned layer that includes:
   first and second ferromagnetic films;
   a ruthenium (Ru) spacer film sandwiched between the first and second ferromagnetic films;
   the first ferromagnetic film interfacing the pinning layer with its magnetic moment pinned by the pinning layer in a first direction; and
   the second ferromagnetic film interfacing the spacer layer with its magnetic moment pinned by the first ferromagnetic film in a second direction that is antiparallel to said first direction.

6. A spin valve sensor as claimed in claim 5 wherein the seed layer is $Ta_yO_x$ which has been reactively ion beam sputtered in the presence of oxygen ($O_2$).

7. A spin valve sensor as claimed in claim 5 wherein the seed layer comprises $Ta_yO_x$ which has been oxidized by exposure to oxygen ($O_2$).

8. A spin valve sensor as claimed in claim 5 wherein the seed layer is copper (Cu).

9. A magnetic head that has an air bearing surface (ABS) comprising:
   a read head that includes:
      a spin valve sensor responsive to applied magnetic fields;
      first and second nonmagnetic electrically insulative gap layers;
      the spin valve sensor being located between the first and second gap layers;
      first and second electrically conductive lead layers located between the first and second gap layers and connected to the spin valve sensor for conducting a sense current through the spin valve sensor;
      ferromagnetic first and second shield layers; and
      the first and second gap layers being located between the first and second shield layers;
      the spin valve sensor including:
         a ferromagnetic pinned layer having a magnetic moment;
         an antiferromagnetic pinning layer of nickel oxide (NiO) exchange coupled to the pinned layer for pinning the magnetic moment of the pinned layer;
         a ferromagnetic free layer;
         a nonmagnetic electrically conductive spacer layer sandwiched between and interfacially engaging the pinned layer and the free layer;
         a seed layer of tantalum oxide or copper; and
         the pinning layer being sandwiched between the seed layer and the pinned layer with the seed layer interfacially engaging the pinning layer.

10. A magnetic head as claimed in claim 9 wherein the seed layer is $Ta_yO_x$ which has been reactively ion beam sputtered in the presence of oxygen ($O_2$).

11. A magnetic head as claimed in claim 9 wherein the seed layer comprises $Ta_yO_x$ which has been oxidized by exposure to oxygen ($O_2$).

12. A magnetic head as claimed in claim 9 wherein the seed layer is copper (Cu).

13. A magnetic head as claimed in claim 9 wherein the pinned layer is an antiparallel (AP) pinned layer that includes:
    first and second ferromagnetic films;
    a ruthenium (Ru) spacer film sandwiched between the first and second ferromagnetic films;
    the first ferromagnetic film interfacing the pinning layer with its magnetic moment pinned by the pinning layer in a first direction; and
    the second ferromagnetic film interfacing the spacer layer with its magnetic moment pinned by the first ferromagnetic film in a second direction that is antiparallel to said first direction.

14. A magnetic head as claimed in claim 13 wherein the seed layer is $Ta_yO_x$ which has been reactively ion beam sputtered in the presence of oxygen ($O_2$).

15. A magnetic head as claimed in claim 13 wherein the seed layer comprises $Ta_yO_x$ which has been oxidized by exposure to oxygen ($O_2$).

16. A magnetic head as claimed in claim 13 wherein the seed layer is copper (Cu).

17. A magnetic disk drive that includes at least one magnetic head that has an air bearing surface (ABS), the disk drive comprising:

the magnetic head including a combined read head and write head;

a read head that includes:
 a spin valve sensor responsive to applied magnetic fields;
 first and second nonmagnetic electrically insulative gap layers;
 the spin valve sensor being located between the first and second gap layers; and
 first and second electrically conductive lead layers located between the first and second gap layers and connected to the spin valve sensor for conducting a sense current through the spin valve sensor;
 ferromagnetic first and second shield layers; and
 the first and second gap layers being located between the first and second shield layers:
 the spin valve sensor including:
  a ferromagnetic pinned layer having a magnetic moment;
  an antiferromagnetic pinning layer of nickel oxide (NiO) exchange coupled to the pinned layer for pinning the magnetic moment of the pinned layer;
  a ferromagnetic free layer;
  a nonmagnetic electrically conductive spacer layer sandwiched between and interfacially engaging the pinned layer and the free layer;
  a seed layer of tantalum oxide or copper; and
  the pinning layer being sandwiched between the seed layer and the pinned layer with the seed layer interfacially engaging the pinning layer;

the write head including:
 first and second pole piece layers and a write gap layer;
 the first and second pole piece layers being separated by the write gap layer at the ABS and connected at a back gap that is recessed rearwardly in the head from the ABS;
 an insulation stack having at least first and second insulation layers;
 at least one coil layer embedded in the insulation stack; and
 the insulation stack and the at least one coil layer being located between the first and second pole piece layers;

the second shield layer and the first pole piece layer being a common layer;

a housing;

a magnetic disk rotatably supported in the housing;

a support mounted in the housing for supporting the magnetic head with the ABS facing the magnetic disk so that the magnetic head is in a transducing relationship with the magnetic disk;

means for rotating the magnetic disk;

positioning means connected to the support for moving the magnetic head to multiple positions with respect to said magnetic disk; and processing means connected to the magnetic head, to the means for rotating the magnetic disk and to the positioning means for exchanging signals with the magnetic head, for controlling movement of the magnetic disk and for controlling the position of the magnetic head.

18. A magnetic disk drive as claimed in claim 17 wherein the pinned layer is an antiparallel (AP) pinned layer that includes:

first and second ferromagnetic films;

a ruthenium (Ru) spacer film sandwiched between the first and second ferromagnetic films;

the first ferromagnetic film interfacing the pinning layer with its magnetic moment pinned by the pinning layer in a first direction; and the second ferromagnetic film interfacing the spacer layer with its magnetic moment pinned by the first ferromagnetic film in a second direction that is antiparallel to said first direction.

19. A magnetic disk drive as claimed in claim 18 wherein the seed layer is $Ta_yO_x$ which has been reactively ion beam sputtered in the presence of oxygen ($O_2$).

20. A magnetic disk drive as claimed in claim 18 wherein the seed layer comprises $Ta_yO_x$ which has been oxidized by exposure to oxygen ($O_2$).

21. A magnetic disk drive as claimed in claim 18 wherein the seed layer is copper (Cu).

* * * * *